United States Patent
Song et al.

(10) Patent No.: US 9,552,122 B2
(45) Date of Patent: Jan. 24, 2017

(54) METHOD FOR MANUFACTURING TOUCH SCREEN PANELS USING A DRY ETCHING APPARATUS

(71) Applicant: SAMSUNG DISPLAY CO., LTD., Yongin, Gyeonggi-Do (KR)

(72) Inventors: Bong-Sub Song, Yongin (KR); Soung-Chang Ku, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/793,168

(22) Filed: Jul. 7, 2015

(65) Prior Publication Data

US 2015/0340205 A1 Nov. 26, 2015

Related U.S. Application Data

(62) Division of application No. 12/929,732, filed on Feb. 11, 2011, now abandoned.

(30) Foreign Application Priority Data

Mar. 16, 2010 (KR) .................. 10-2010-0023238

(51) Int. Cl.
*H01J 37/32* (2006.01)
*G06F 3/044* (2006.01)

(52) U.S. Cl.
CPC ......... *G06F 3/044* (2013.01); *H01J 37/32091* (2013.01); *H01J 2237/3346* (2013.01)

(58) Field of Classification Search
CPC ................. G06F 3/044; H01J 37/32091; H01J 2237/3346
See application file for complete search history.

(56) References Cited

U.S. PATENT DOCUMENTS 6,136,723 A 10/2000 Nagase
6,261,406 B1 * 7/2001 Jurgensen ......... H01J 37/32623
156/345.3

(Continued)

FOREIGN PATENT DOCUMENTS

JP 2002-319577 A 10/2002
KR 10-2000-0022632 A 4/2000

(Continued)

OTHER PUBLICATIONS

Dictionary.com, "side," in Dictionary.com Unabridged. http://dictionary.reference.com/browse/side. Available: http://dictionary.reference.com. Accessed: Mar. 26, 2015.

(Continued)

*Primary Examiner* — Nadine Norton
*Assistant Examiner* — Mahmoud Dahimene
(74) *Attorney, Agent, or Firm* — Lee & Morse, P.C.

(57) ABSTRACT

A dry etching apparatus for performing dry etching in manufacture of a set of touch screen panels on a mother substrate, including a chamber, an upper electrode in the chamber at an upper portion thereof, the upper electrode configured to apply a high-frequency power source (RF) to the interior of the chamber, a lower electrode in the chamber at a lower portion thereof, the lower electrode configured to apply the high-frequency power source to the interior of the chamber, a gas injection port configured to inject a compound mixture gas into the chamber, an exhaust port configured to exhaust a reactive gas produced in the interior of the chamber, and a shadow mask disposed above a location on the lower electrode for the mother substrate for the touch screen panels, the shadow mask having a plurality of exposure windows respectively corresponding to a plurality of exposure portions to be formed.

7 Claims, 9 Drawing Sheets

(56) References Cited

U.S. PATENT DOCUMENTS

| | | | |
|---|---|---|---|
| 6,872,281 | B1 | 3/2005 | Chen et al. |
| 8,345,020 | B2 | 1/2013 | Jeong et al. |
| 2004/0069412 | A1 | 4/2004 | Inomata et al. |
| 2007/0193973 | A1 | 8/2007 | Kim et al. |
| 2008/0062148 | A1* | 3/2008 | Hotelling ............ G02F 1/13338 345/174 |
| 2008/0116169 | A1 | 5/2008 | Yang et al. |

FOREIGN PATENT DOCUMENTS

| | | |
|---|---|---|
| KR | 10-2006-0131276 A | 12/2006 |
| KR | 10-2008-0046582 A | 5/2008 |
| KR | 10-2010-0084261 A | 7/2010 |

OTHER PUBLICATIONS

Office Action dated Jun. 25, 2011 from KR 10-2010-0023238 (Song, et al.).
Office Action dated Oct. 28, 2011 in KR 10-2010-0023238 (Song, et al.).

\* cited by examiner

FIG. 7

| FILM | THICKNESS (Å) | CONDITION | HARDNESS |
|---|---|---|---|
| INORGANIC INSULATING FILM | | CURRENT CONDITION | 4H |
| SiNx | 2000 | NORMAL | 4H |
| SiO$_2$ | 2000 | NORMAL | 9H |
| | 2000 | N$_2$O UP(3000 → 6000)[sccm] | 9H OR HIGHER |
| | 2000 | RF UP (650 → 1000)[W] | |
| | 2000 | PRESSURE DOWN (1500 → 1000)[mTorr] | |
| | 2000 | PRESSURE UP (1500 → 2000)[mTorr] | |
| DOUBLE FILM SiO$_2$+SiNx | 2000+300 | PRESSURE UP (1500 → 2000)[mTorr] | |

METHOD FOR MANUFACTURING TOUCH SCREEN PANELS USING A DRY ETCHING APPARATUS

CROSS REFERENCE TO RELATED APPLICATION

This is a divisional application based on pending application Ser. No. 12/929,732, filed Feb. 11, 2011, the entire contents of which is hereby incorporated by reference.

BACKGROUND

1. Field

Embodiments relate to a dry etching apparatus and a method for manufacturing touch screen panels using the same.

2. Description of the Related Art

A touch screen panel is an input device that allows a user's instruction to be inputted by selecting an instruction content displayed on a screen, such as an image display device, with a user's hand or an object.

The touch screen panel may be formed on a front face of the image display device to convert a contact position into an electrical signal. Here, the user's hand or object may be in direct contact with the touch screen panel at the contact position. Accordingly, the instruction content selected at the contact position may be inputted as an input signal to the image display device.

Since such a touch screen panel can be substituted for a separate input device connected to an image display device, such as a keyboard or mouse, its fields of application have been gradually extended.

SUMMARY

It is a feature of an embodiment to provide an apparatus for performing a dry etching process and a method for manufacturing touch screen panels using the same.

At least one of the above and other features and advantages may be realized by providing a dry etching apparatus for performing dry etching in the manufacture of a set of touch screen panels on a mother substrate, the apparatus including a chamber configured to maintain a high vacuum at an interior thereof, an upper electrode in the chamber at an upper portion thereof, the upper electrode configured to apply a high-frequency power source (RF) to the interior of the chamber, a lower electrode in the chamber at a lower portion thereof, the lower electrode configured to apply the high-frequency power source to the interior of the chamber, a gas injection port configured to inject a compound mixture gas into the chamber, an exhaust port configured to exhaust a reactive gas produced in the interior of the chamber, and a shadow mask disposed above a location on the lower electrode for the mother substrate for the touch screen panels, the shadow mask having a plurality of exposure windows respectively corresponding to a plurality of exposure portions to be formed in individual touch screen panels of the mother substrate.

The dry etching apparatus for performing dry etching in the manufacture of a set of touch screen panels on a mother substrate may be configured to etch $SiO_2$ from a CVD layer of $SiO_2$ on the mother substrate.

At least one of the above and other features and advantages may also be realized by providing a method for manufacturing touch screen panels using a dry etching apparatus, the method including forming patterns on a mother substrate for manufacturing a plurality of touch screen panels, the patterns including sensing cells and interconnections, depositing $SiO_2$ on the mother substrate having the patterns formed thereon, loading the mother substrate having the $SiO_2$ deposited thereon into a dry etching apparatus and performing a dry etching process using the dry etching apparatus, the dry etching apparatus having a shadow mask in which exposure windows are formed respectively corresponding to exposure portions of touch screen panels on the mother substrate, and performing a scribing process with respect to the mother substrate after the dry etching process, the scribing process dividing the mother substrate into individual touch screen panels.

The forming of the patterns may include a first ITO patterning process, a metal line patterning process, an organic insulating film patterning process, and a second ITO patterning process.

The $SiO_2$ may be deposited on the mother substrate using a CVD method.

The exposure portions may be formed at one side of each of the touch screen panels on the mother substrate so as to allow connection of the interconnections to an external device, and the $SiO_2$ deposited in the depositing of the $SiO_2$ may be removed from the exposure portions through the dry etching process.

BRIEF DESCRIPTION OF THE DRAWINGS

The above and other features and advantages will become more apparent to those of skill in the art by describing in detail example embodiments with reference to the attached drawings, in which:

FIG. 7 illustrates a table of experimental results comparing the hardness of an inorganic insulating film applied to a comparative touch screen panel and the hardness of $SiO_2$ applied to a touch screen panel according to an embodiment.

DETAILED DESCRIPTION

Figure 1:
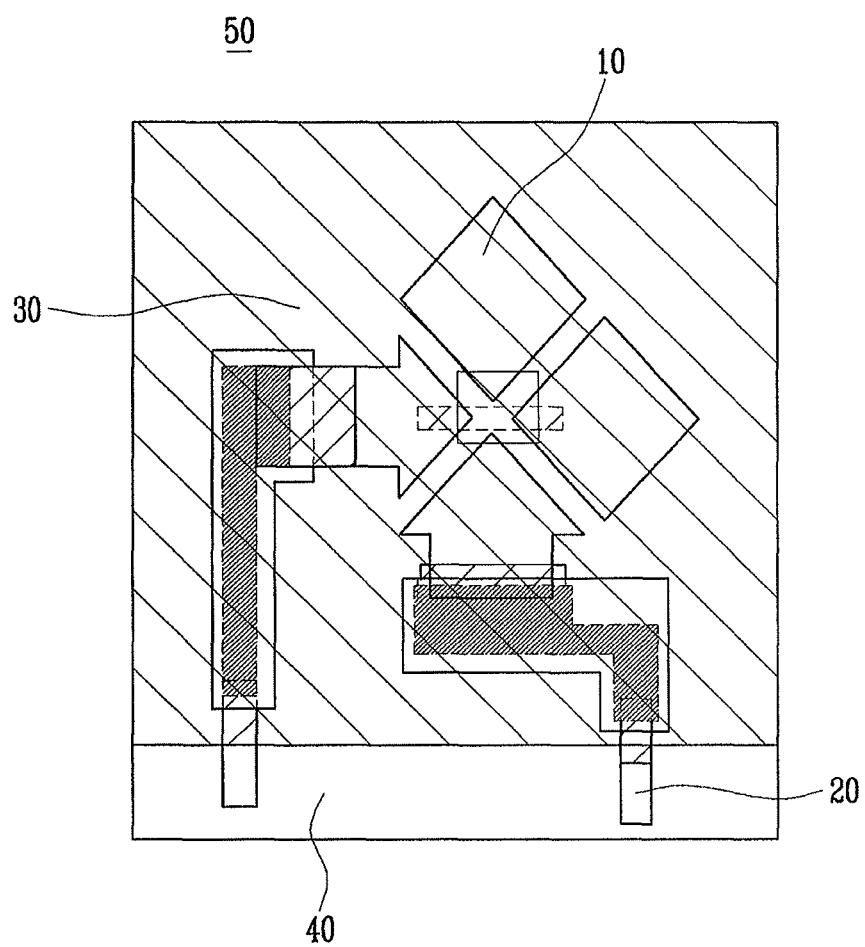
FIG. 1 illustrates a schematic plan view of an example touch screen panel manufactured according to an embodiment.

Korean Patent Application No. 10-2010-0023238, filed on Mar. 16, 2010, in the Korean Intellectual Property Office, and entitled: "Dry Etching Apparatus and Method for Manufacturing Touch Screen Panels Using the Same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Also, when an element is referred to as being "connected to" another element, it can be directly connected to the another element or be indirectly connected to the another element with one or more intervening elements interposed therebetween. Like reference numerals refer to like elements throughout.

FIG. 1 illustrates a schematic plan view of an example touch screen panel manufactured according to an embodiment.

For convenience of illustration, sensing cells of one unit are shown in FIG. 1. It will be appreciated that the touch screen panel may include a plurality of sensing cells formed on row lines and column lines in a touch active area.

Figure 2:
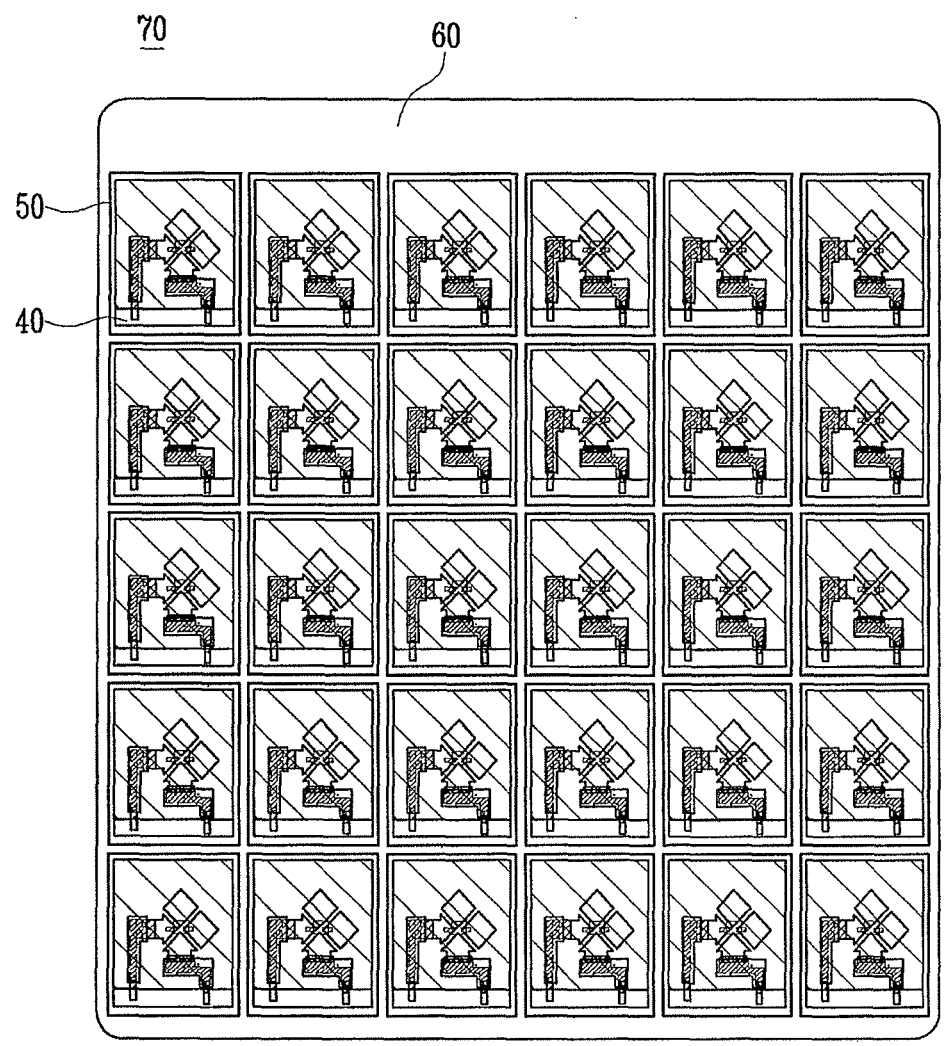
FIG. 2 illustrates a plan view of an example mother substrate manufactured according to an embodiment.

FIG. 2 illustrates a plan view of an example mother substrate manufactured according to an embodiment. FIG. 2 shows a mother substrate having a plurality of touch screen panels shown in FIG. 1 formed thereon.

Referring to FIG. 1, a touch screen panel 50 manufactured according an embodiment may include sensing cells 10 formed in a touch active area. As noted above, although sensing cells of one unit are shown in FIG. 1, a plurality of sensing cells may be formed. The touch screen panel 50 may further include an interconnection 20 connected to each of the sensing cells. The interconnection 20 may be formed outside of the outline of the touch active area. The sensing cells and the interconnections may be covered and protected by $SiO_2$ 30.

An external device and an exposure portion 40 may be formed at one side of the touch screen panel, e.g., at a lower end of the touch screen panel as shown in FIG. 1. For example, the external device may be a capacitance sensor chip for analyzing a position touched by a user based on sensing information transmitted from sensing cells, or the like. The interconnections 20 may be exposed at the exposure portion 40 for the purpose of connection thereof.

As shown in FIG. 2, a mother substrate 70 may be formed by forming a plurality of touch screen panels on one large substrate 60. The mother substrate 70 may then separated into individual touch screen panels through a scribing process. Thus, an individual touch screen panel 50 (including sensing cells, interconnections 20, and an exposure portion 40 as described above) need not be formed on its own individual substrate.

In the following description, the mother substrate 70 means that a plurality of touch screen panels are formed on a substrate 60 as shown in FIG. 2, and the substrate 60 simply means a glass substrate for forming the mother substrate 70.

When a plurality of touch screen panels 50 are to be formed for the mother substrate 70 as shown in FIG. 2, an embodiment provides a dry etching apparatus using a shadow mask for forming exposure portions 40 after depositing $SiO_2$ 30 using a chemical vapor deposition (CVD) method. Embodiments also provide a method for manufacturing touch screen panels 50 using such a dry etching apparatus.

Hereinafter, the configuration of a dry etching apparatus according an embodiment will be described with reference to FIGS. 3 and 4. Thereafter, a method for manufacturing touch screen panels 50 using the dry etching apparatus according to an embodiment will be described with reference to FIG. 5.

Figure 3:
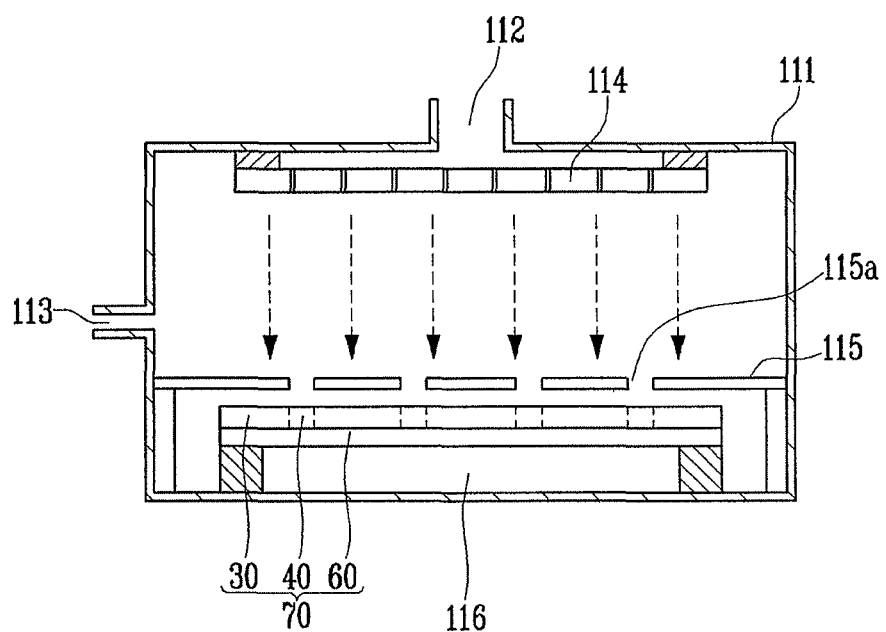
FIG. 3 illustrates a configuration of a dry etching apparatus according to an embodiment.

FIG. 3 illustrates a configuration of a dry etching apparatus according to an embodiment. FIG. 4 illustrates a plan view of a shadow mask applied to the dry etching apparatus according to an embodiment.

Dry etching may be used to perform an etching process using a reaction with gas plasma in micromachining, without utilizing wet etching. A dry etching apparatus using such a dry etching method according an embodiment is shown in FIG. 3.

Referring to FIG. 3, the dry etching apparatus according to an embodiment may include a chamber 111 configured to maintain a high vacuum, an upper electrode 114 at an upper portion in the chamber 111 to apply a high-frequency power source (RF) to the interior of the chamber 111, a lower electrode 116 at a lower portion in the chamber 111 to apply the high-frequency power source to the interior of the chamber 111, a gas injection port 112 for injecting therethrough a compound mixture gas into the chamber 111, an exhaust port 113 for exhausting therethrough a reactive gas produced in the interior of the chamber 111, and a shadow mask 115 having exposure windows 115a formed therein. The shadow mask 115 may be disposed above a location for the mother substrate 70. Referring to FIGS. 2 and 3, the exposure windows 115a respectively correspond to exposure portions 40 to be formed in individual touch screen panels 50 on the mother substrate 70. The mother substrate 70 may be positioned on the lower electrode 116. Insulators may be further formed at left and right sides of the lower electrode 116, respectively.

The dry etching apparatus may be used to remove $SiO_2$ by etching using plasma. The $SiO_2$ to be removed may be a portion (corresponding to the exposure portion 40 of each of the touch screen panels 50) in the $SiO_2$ 30 deposited by a CVD method on the mother substrate 70. Thus, the dry etching apparatus according to the present embodiment may be used to etch $SiO_2$ deposited on the exposure portions 40 of the plurality of touch screen panels 50 formed on the mother substrate 70 described in FIG. 2.

Figure 4:
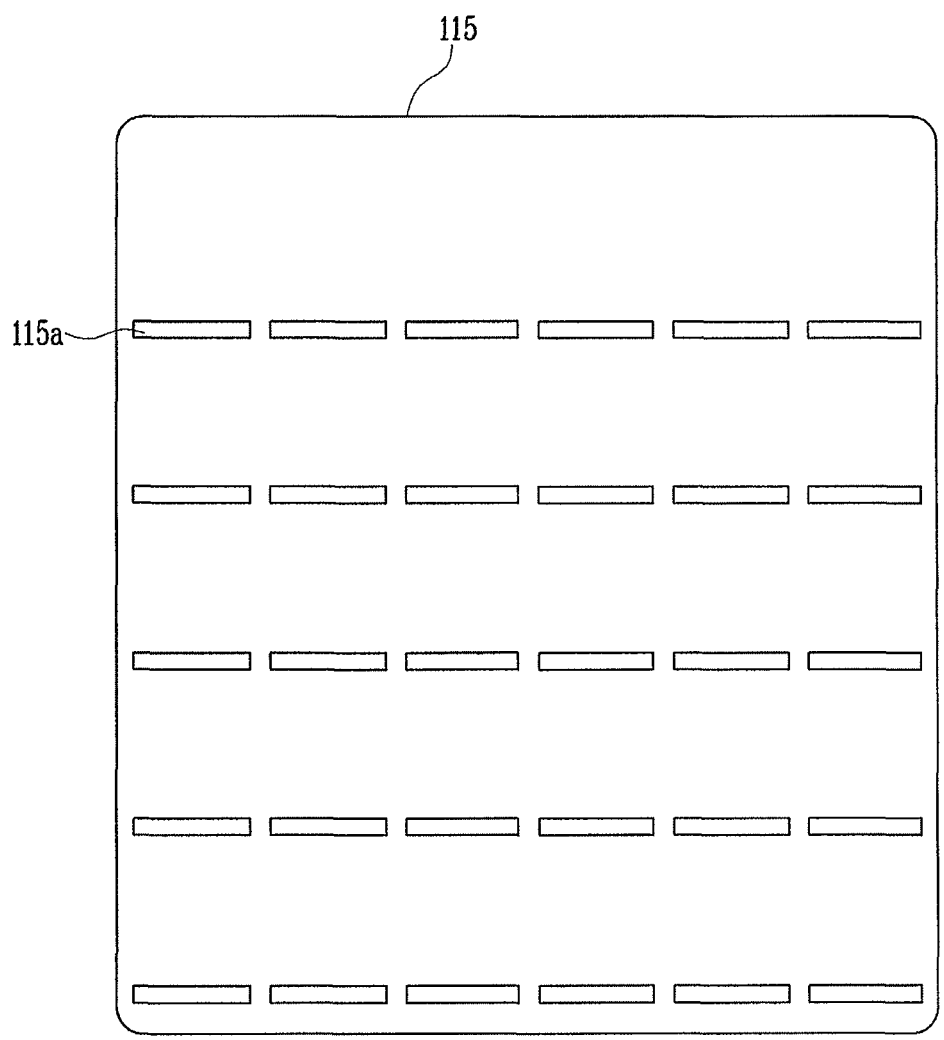
FIG. 4 illustrates a plan view of a shadow mask applied to the dry etching apparatus according to an embodiment.

The exposure windows 115a respectively matched to the exposure portions 40 of the touch screen panels 50 pass through the shadow mask 115, as shown in FIGS. 3 and 4. Therefore, plasma generated by the upper and lower electrodes 114 and 116 reaches each of the exposure portions 40 on the mother substrate 70 through respective exposure windows 115a from the top of the shadow mask 115. Then, the plasma removes $SiO_2$ by reacting with the $SiO_2$ deposited on each of the exposure portions 40. Accordingly, the mother substrate 70 having touch screen panels 50 formed thereon as shown in FIG. 2 may be formed using the dry etching apparatus according to an embodiment. Here, the mother substrate 70 shown in FIG. 2 refers to a mother substrate in the state that the exposure portions 40 are exposed using the dry etching apparatus shown in FIG. 3.

Hereinafter, a method of manufacturing the mother substrate shown in FIG. 2 using the dry etching apparatus shown in FIG. 3 and then manufacturing individual touch screen panels will be described.

Figure 5:
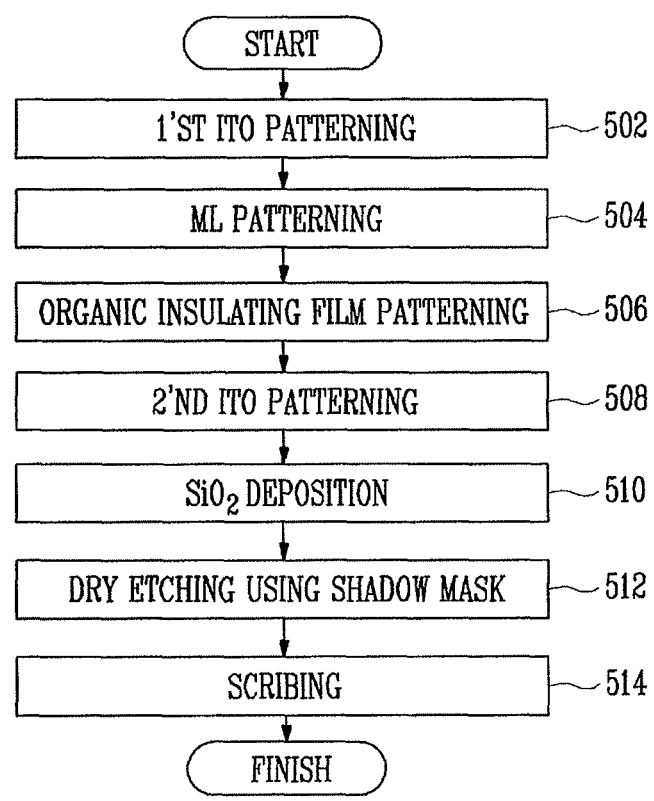
FIG. 5 illustrates a flowchart of a method for manufacturing touch screen panels according to an embodiment.

FIG. 5 illustrates a flowchart of a method for manufacturing touch screen panels according to an embodiment. FIG. 6(a) through 6(f) illustrate stages in an example manufacturing process according to an embodiment. Here, the manufacturing processes may be processes generally used to manufacture touch screen panels, except for using a process (see operation 510 in FIG. 5) of depositing a SiO₂ insulating film and a process (see operation 512 in FIG. 5) of performing a dry etching process using a shadow mask, as described in detail below. Therefore, the manufacturing processes will be briefly described.

For clarity, FIGS. 6(a) to 6(e) illustrate the formation of interconnections for one touch screen panel 50 on a substrate. However, it will be appreciated that the mother substrate 70 may have a plurality of touch screen panels 50 formed on one substrate 60 as described above. Thus, in FIGS. 6(a) to 6(e), a plurality of touch screen panels 50 may be formed on the mother substrate 70 as shown in FIG. 6(f).

Figure 6:
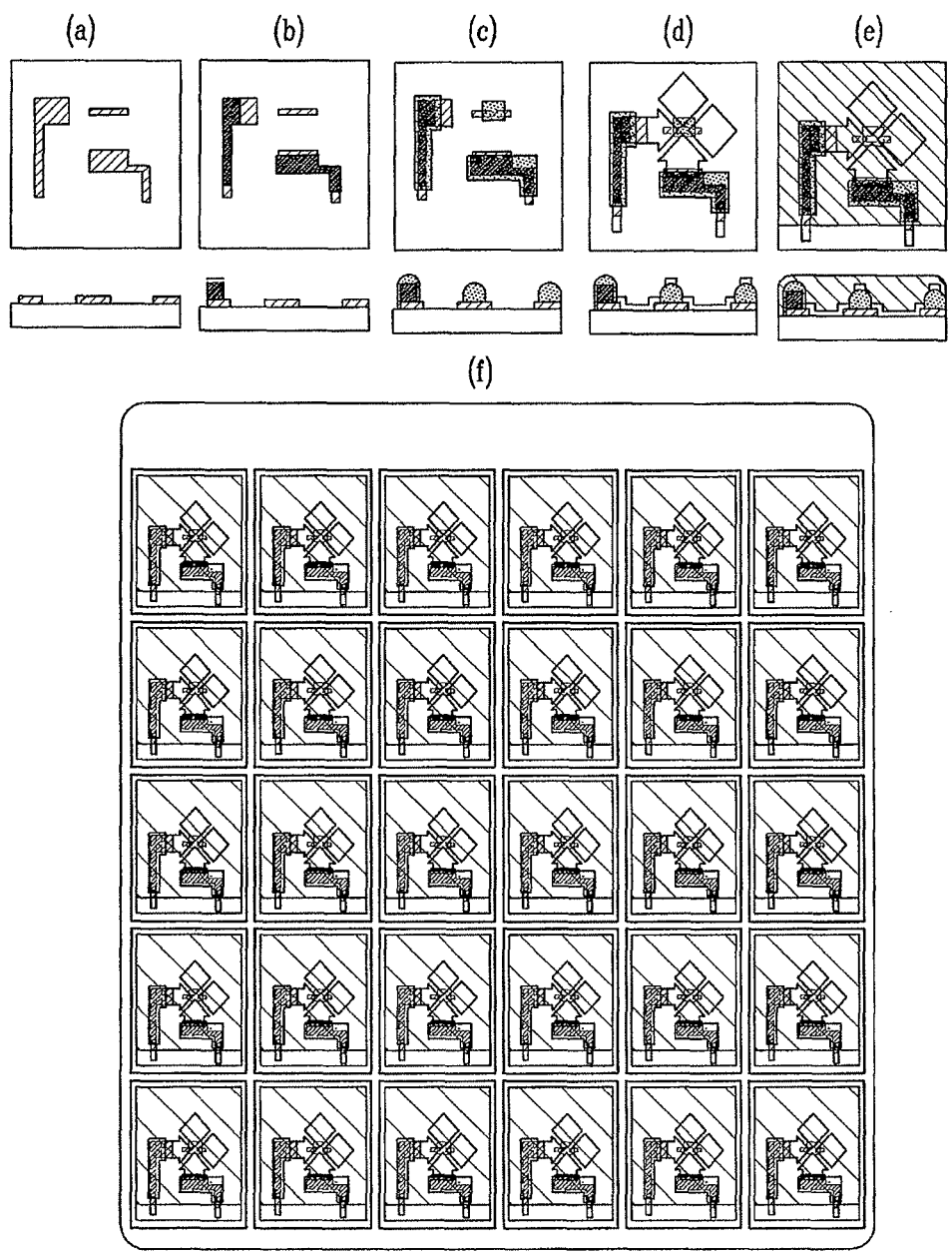
FIG. 6(a) through 6(f) illustrate stages in an example manufacturing process according to an embodiment.

In manufacturing touch screen panels 50 according to an embodiment, a portion of interconnections and a bridge pattern may be formed through a first ITO patterning process, as shown in FIG. 6(a) (see operation 502 in FIG. 5). Subsequently, various patterns shown in FIGS. 6(b) to 6(d) may be formed on the mother substrate 70 through a metal line (ML) patterning process (see operation 504 in FIG. 5), an organic insulating film process (see operation 506 in FIG. 5), and a second ITO patterning process (see operation 508 in FIG. 5).

Through the aforementioned operations 502 to 508 of FIG. 5, patterns for performing basic operations of the touch screen panels 50 may be formed on the mother substrate 70. Then, SiO₂ may be deposited on the patterns using a CVD method (see operation 510 in FIG. 5). In an implementation, SiO₂ may be deposited on the entire surface of the substrate having the patterns thereon.

Subsequently, the mother substrate 70 having the SiO₂ deposited thereon may be loaded into the dry etching apparatus shown in FIG. 3 to perform a dry etching process (see operation 512 in FIG. 5). The shadow mask 115 may be used in the dry etching apparatus. Thus, only SiO₂ on each of the exposure portions 40 may be etched (among all the SiO₂ deposited on the mother substrate 70), as the exposure windows 115a formed in the shadow mask 115 may be respectively matched to the exposure portions 40 of the touch screen panels 50 formed on the mother substrate 70.

In the present embodiment, the shadow mask 115, in which the exposure windows 115a are respectively matched to the exposure portions 40 of the touch screen panels 50 formed on the mother substrate 70, may be loaded into the dry etching apparatus, so that the exposure portions 40 may be formed without performing a photo process.

After the dry etching process is performed as described above, subsequent processes for manufacturing the touch screen panels, e.g., a GND ITO film growing process, a GND inorganic insulating film process, and the like, may be additionally performed. Then, the mother substrate 70 may be separated into individual touch screen panels 50 through a scribing process (see operation 514 in FIG. 5).

FIG. 7 illustrates a table of experimental results comparing the hardness of an inorganic insulating film applied to a comparative touch screen panel and the hardness of SiO₂ applied to a touch screen panel according to an embodiment. Referring to FIG. 7, it can be seen that the hardness of the SiO₂ applied to a touch screen panel according to an embodiment is excellent.

Figure 8A:
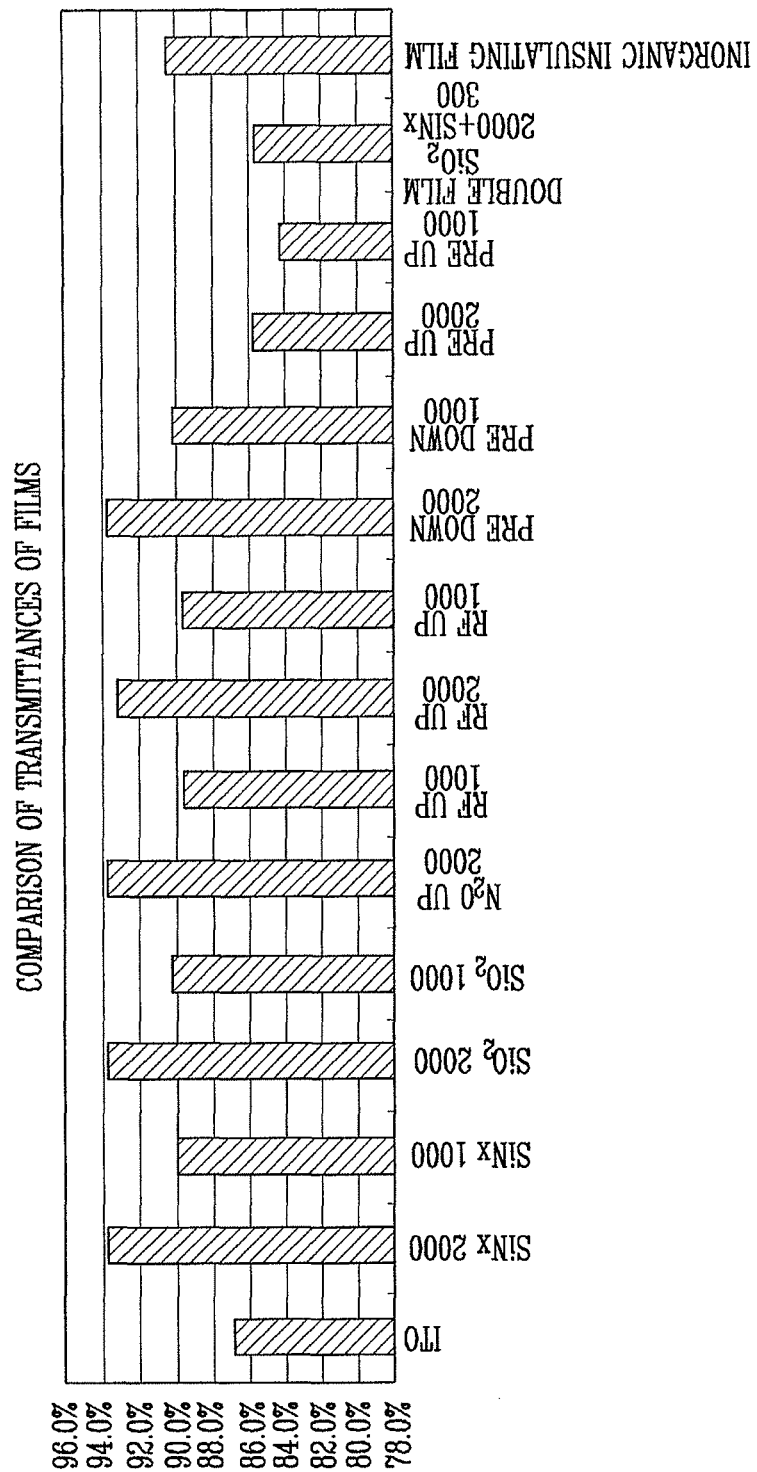
FIGS. 8A and 8B illustrate graphs of experimental results comparing transmittance of an inorganic insulating film applied to the comparative touch screen panel and transmittance of $SiO_2$ applied to a touch screen panel according to an embodiment.
Figure 8B:
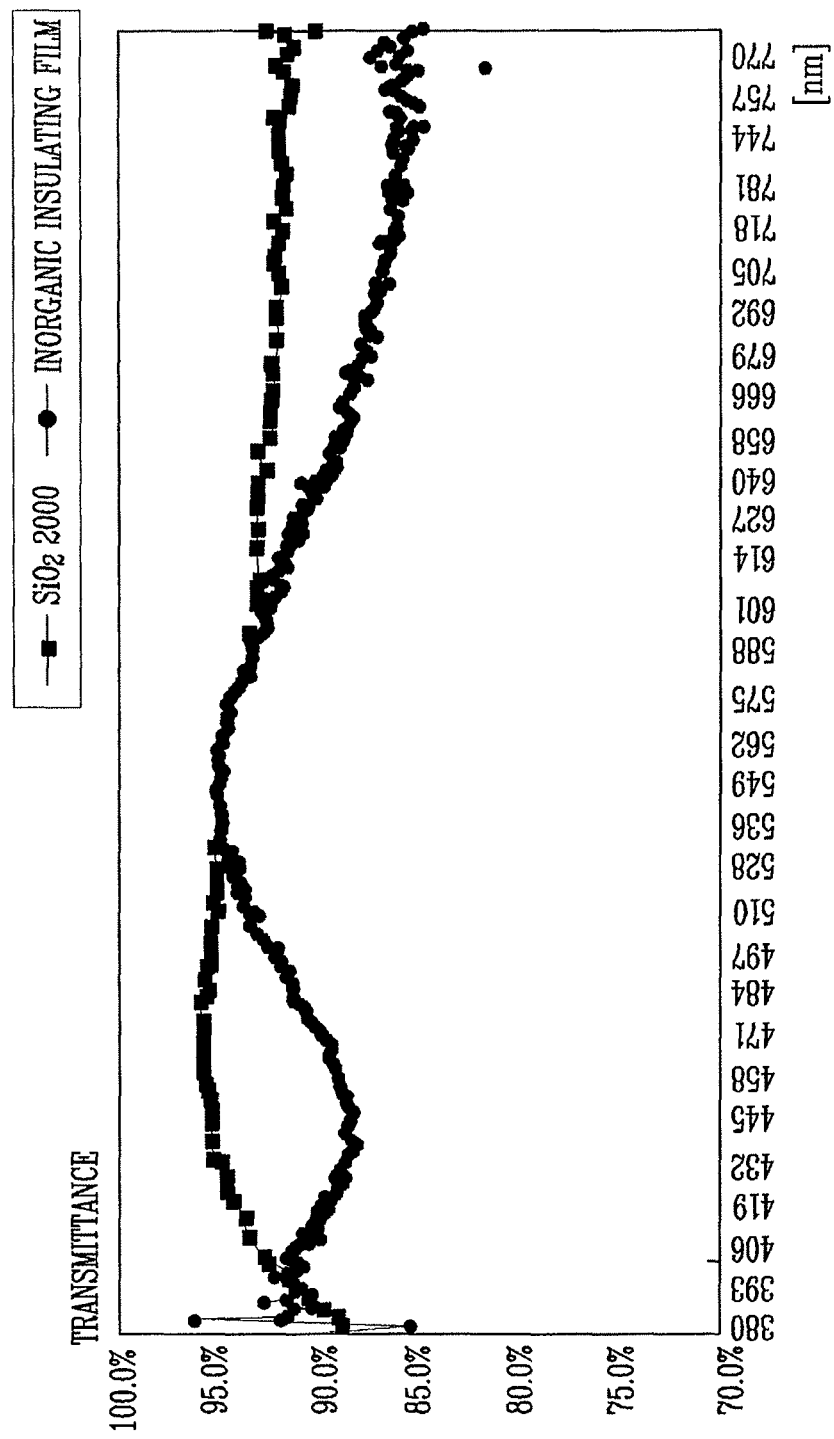

FIGS. 8A and 8B illustrate graphs of experimental results comparing transmittance of an inorganic insulating film applied to the comparative touch screen panel and transmittance of SiO₂ applied to a touch screen panel according to an embodiment. Referring to FIGS. 8A and 8B, it can be seen that a transmittance identical to, or higher than, that of the inorganic insulating film may be attained using the SiO₂.

In order to examine whether or not dry etching patterns can be formed using the shadow mask according to an embodiment, an experiment was performed by attaching a portion for forming patterns having a shadow mask shape to a glass substrate. As a result, it can be seen that when plasma is partially blocked in the shadow mask shape, the opened portion is normally etched. Tests were performed in various conditions by attaching a blocking mask (Teflon pad) to a CVD monitoring glass (triple-layered film). The tests were performed under the following conditions. First, the gap between the glass and the mask was 1 mm to 2 mm, and the widths of internal holes were 2 mm, 3 mm and 5 mm, respectively. Second, the tests were performed for an active etch time of 47 seconds. As the result of the examination, it can be seen that as the gap was narrowed, mask center hole portions were uniformly etched, and a masking portion was etched up to a maximum of 700 Å as compared with the initial value of N+a-si, without a significant difference in gap.

Touch screen panels may be manufactured using various methods. For example, in case of a touch screen panel manufactured through a first ITO patterning process, a metal line patterning process, an organic insulating film patterning process, a second ITO patterning process, an inorganic insulating film patterning process, a GND ITO film growing process, and a GND inorganic insulating film process, the inorganic insulating film (used as a protection film after the second ITO patterning process) may not provide satisfactory hardness for a touch screen panel. Accordingly, a CVD insulating film of SiO₂ may be used in place of the inorganic insulating film. In this case, the SiO₂ may provide increased hardness, but may also require an additional photo process.

The hardness desired for a touch screen panel may be 4H or higher. The hardness of current inorganic insulating films may be 5H, which is only slightly above the desired hardness. Thus, there is a need for an increase in hardness. To this end, SiO₂ may be used in place of the general inorganic insulating film. However, if SiO₂ is used, a CVD deposition process, a photo process, and a dry etching process may be required, increasing the number of processes used to manufacture. Accordingly, manufacturing cost may be increased.

In contrast, according to embodiments, the inorganic insulating film process performed after the second ITO patterning process may be omitted, and the dry etching process may be performed while skipping the photo process after depositing SiO₂ using the CVD method, thereby forming SiO₂ patterns. That is, the related art inorganic insulating film may be replaced by the SiO₂. The SiO₂ deposited using the CVD method may have a higher hardness than that required in current touch screen panels. As described above, exposure portions (to be exposed for the purpose of electrical connection to an external device) may be exposed (using a dry etching process that uses a shadow mask) in the SiO₂ deposited using a CVD method. The shadow mask may protect patterns produced through the second ITO patterning process. Thus, the hardness may be improved while a photo process may be omitted, simplifying manufacturing processes and reducing manufacturing costs.

As described above, embodiments may provide a dry etching apparatus for exposing exposure portions to be exposed for the purpose of electrical connection to an external device through a dry etching process using a shadow mask in SiO₂ deposited using a CVD method so as to protect patterns produced through a second ITO patterning process on a mother substrate for manufacturing a plurality of touch screen panels, and a method for manufacturing touch screen panels using the dry etching apparatus.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method for manufacturing touch screen panels using a dry etching apparatus, the method comprising:

forming patterns on a mother substrate for manufacturing a plurality of touch screen panels, the patterns including sensing cells and interconnections;

depositing SiO₂ on the mother substrate having the patterns formed thereon;

loading the mother substrate having the SiO₂ deposited thereon into a dry etching apparatus; and performing a dry etching process in which SiO₂ deposited in the depositing of the SiO₂ is removed using the dry etching apparatus, the dry etching apparatus having a shadow mask in which exposure windows are formed respectively corresponding to exposure portions of touch screen panels on the mother substrate, wherein the shadow mask is between one of a pair of electrodes and a surface to support the mother substrate and is spaced from the support surface by a distance greater than a thickness of the mother substrate so as not to contact either of the mother substrate or the support surface, the pair of electrodes to generate an electric field during the dry etching process; and performing a scribing process with respect to the mother substrate after the dry etching process, the scribing process dividing the mother substrate into individual touch screen panels.

2. The method as claimed in claim 1, wherein the forming of the patterns includes a first ITO patterning process, a metal line patterning process, an organic insulating film patterning process, and a second ITO patterning process.

3. The method as claimed in claim 1, wherein the SiO₂ is deposited on the mother substrate using a CVD method.

4. The method as claimed in claim 1, wherein:

the exposure portions are formed at one side of each of the touch screen panels on the mother substrate so as to allow connection of the interconnections to an external device, and the SiO₂ deposited in the depositing of the SiO₂ is removed from the exposure portions through the dry etching process.

5. The method as claimed in claim 1, wherein the SiO₂ deposited on the mother substrate has a hardness of 9H or higher.

6. The method as claimed in claim 1, wherein the method does not include an inorganic insulating film process performed after a second indium tin oxide patterning process.

7. The method as claimed in claim 3, wherein the dry etching process is performed while skipping a photo process after depositing the SiO₂ using the CVD method.

* * * * *